United States Patent
Stiebig et al.

[11] Patent Number: 5,998,806
[45] Date of Patent: Dec. 7, 1999

[54] THREE-COLOR SENSOR WITH A PIN OR NIP SERIES OF LAYERS

[75] Inventors: Helmut Stiebig, Jülich; Joachim Fölsch, Alzenau; Dietmar Knipp, Aachen, all of Germany

[73] Assignee: Forschungszentrum Julich GmbH, Julich, Germany

[21] Appl. No.: 09/155,489
[22] PCT Filed: Apr. 7, 1997
[86] PCT No.: PCT/DE97/00713
  § 371 Date: Sep. 25, 1998
  § 102(e) Date: Sep. 25, 1998
[87] PCT Pub. No.: WO97/38450
  PCT Pub. Date: Oct. 16, 1997

[30] Foreign Application Priority Data

Apr. 9, 1996 [DE] Germany .............. 196 13 820

[51] Int. Cl.⁶ .............. H01L 29/04; H01L 31/0328; H01L 31/0336
[52] U.S. Cl. .............. 257/55; 257/63; 257/185; 257/191; 257/440; 257/458; 257/460
[58] Field of Search .................. 257/53, 54, 55, 257/63, 184, 185, 191, 440, 458, 460

[56] References Cited

U.S. PATENT DOCUMENTS 5,557,133 9/1996 De Cesare et al. .............. 257/440
5,682,037 10/1997 De Cesare et al. .............. 250/372

FOREIGN PATENT DOCUMENTS 0 682 375 A1 11/1995 European Pat. Off. .
WO 96/13865 5/1996 WIPO .

OTHER PUBLICATIONS

Amorpghous Silicon Three Color Detector by H. Stiebig et al. (Mat.Res.Soc. Symp. Proc. vol. 377–1995).

Tunable Photodetectors Based on Amorphous Si/SiC Heterostructures by De Cesare et al. (8093 IEEE Transactions on Electronic Devices 42(May 1995) No. 5).

Amorphous Si/SiC Three–Color Detector by Hsiung–Kuang Tsai et al. (published Nov. 12, 1987 by University of Taiwan).

Primary Examiner—Ngân V. Ngô
Attorney, Agent, or Firm—Herbert Dubno

[57] ABSTRACT

A pin or nip layer sequence, especially for use as a color sensor in electrooptical components. The bond gap of a first intrinsic (i) layer closer to the light input side is greater than the bond gap of a second i layer adjacent to the first and further removed from the light input side. The new $\mu\tau$ product for the i layer furthest distant from the layer is greater than the $\mu\tau$ product of an i layer closer is the n layer.

10 Claims, 10 Drawing Sheets

THREE-COLOR SENSOR WITH A PIN OR NIP SERIES OF LAYERS

CROSS REFERENCE TO RELATED APPLICATIONS

This application is a national stage of PCT/DE97/00713 filed Apr. 7, 1997 and based, in turn, on German National Application 196 13 820.5 of Apr. 9, 1996.

FIELD OF THE INVENTION

The invention relates to a multi layer pin or nip structure with a plurality of i layers which are bounded on one side by a p layer and on the other side by a n layer. The invention further relates to an electrooptical component containing such a structure, especially a multicolor sensor, on the basis of a pin or nip structure according. The invention also relates to a process for producing such a structure.

BACKGROUND OF THE INVENTION

The components known in of the art based upon amorphous silicon or its alloys are comprised of two antiserially-arranged pin or nip diodes for forming a pinip structure or a nipin structure. The diodes are here arranged substantially perpendicular to the incident light direction.

Such an nipin structure having a photosensitive electronic component based upon amorphous silicon is known for example from U.S. Pat. No. 5,311,047. It is known to optimize such a nipin structure with reference to the spectral sensitivity dependent on the voltage applied to this structure.

The incorporation of additional intrinsically conducting layers on both sides of the p-doped layer with a band gap between 1.74 eV and 1.9 eV, can improve the blue/green sensitivity in of an nip structure in the incident light direction or the red/green separation in a following pin structure in the incident light direction. (Q. Zhu, H. Stiebig, P. Rieve, J. Giehl, M. Sommer, M. Böhm, "NEW TYPE OF THIN FILM IMAGE SENSOR" in Sensors and Control for Advanced Automation, edited by M. Becker, R. W. Daniel, O. Loffeld, Proc. SPEI 2247 (1994) 301).

It is known to absorb blue light preferentially in the first intrinsically-conducting (i) layer, to absorb green light in the front part of the intrinsically-conducting layer and rear diode and to absorb red light by reduction of the $\mu\tau$ product in the rear part of the second intrinsically-conducting layer. For that purpose a nipin structure is used in which one or more additional intrinsic layers are provided. (H. Stiebig, J. Giehl, D. Knipp, P. Rieve, M. Böhm, AMORPHOUS SILICON THREE COLOR DETECTOR in MRS Symp. Proc. 377 (1995) 813 or H. Stiebig, C. Ulrichs, T. Kulessa, J. Fölsch, F. Finger, H. Wagner, TRANSIENT PHOTOCURRENT RESPONSE OF A-SI:H BASED THREE COLOR NIPIN DETECTORS, in ICAS 16, Kobe, Japan, Sep. 4–8 1995). Here $\tau$ is the lifetime of the charge carrier generated by the instant light and $\mu$ is its mobility.

A disadvantage of the known components described is that only up to three linear independent structural sensitivity paths can be detected with this construction of the layer system. As a result a comparatively expensive superposition of these three independent signals is required for color image processing.

OBJECTS OF THE INVENTION

It is the object of the invention, therefore, to provide a structure with a plurality of i layers in which the independent signals are so obtained that less superposition is required to the point that it is possible to avoid such superpositioning altogether.

It is also an object of the invention to provide an economically fabricated optoelectronic component, especially a multicolor sensor, the spectral sensitivity of which can be continuously shifted by variation of the applied voltage and thus a spectral sensitivity with desired boundary conditions can be obtained for the detection of more than three linearly independent curves or graphs of the spectral sensitivity in the incident light range from UV to near IR.

SUMMARY OF THE INVENTION

These objects are attained with a structure wherein a plurality of i layers are bonded on one side with a p layer and on the other side with an n layer. These i (intrinsically conducting) layers are formed so that they constitute:

in the incident light direction at least in the boundary region between two neighboring i layers ($i^I$, $i^{II}$), a band gap Eg(I) of the respective first i layer ($i^I$) at the side neighboring the light input side, which is greater than a band gap $E_g$(II) of the second neighboring i layer ($i^I$) which is further away from the light input side, and in the direction of the p to n layer at least in the boundary region of two neighboring i layers ($i^I$, $i^{II}$) a product $\mu\tau$ (I) which is greater for the i layer ($i^I$) further away from the n layer than the product $\mu\tau$ (II) of the i layer ($i^{II}$) more closely neighboring the n layer.

It has been found that, for broadening the functionality of a device containing such a structure, from the incident light direction outwardly, as a rule the respective band gap $E_g$ of the individual i layers is reduced by a suitable choice of the alloys, while the transport characteristics (which can be characterized with the aid of the product $\mu\tau$) of the photo-generated charge carriers for a nipin structure is improved in both intrinsic layer systems of the top diode and bottom diode in the direction of the p layer. For a pinip structure, as a rule, the band gap of the individual layers, can be reduced by a suitable choice of the alloy from the light impingement direction as with the nipin structure while the $\mu\tau$ product rises from the central n layer to both p conducting layers.

By stating, "as a rule" it is meant that it has been found that at least in the boundary region between two neighboring i layers the formulation in the main claim for the band gap and the transport characteristics are fulfilled. Thus in an advantageous manner within the respective i layer the value of the band gap and the transport characteristics are held constant. It is, however, conceivable to permit a limited variation of the respective values within the respective i layer.

Furthermore, the collection of the charge carriers by a change in the electric field (for example by microdoping the i layer) can be influenced so as to permit the spatial charge carrier collection to be varied in this manner.

It has been found, in this connection, that the structures are not limited to structures of the nipin or pinip type. Rather, and also encompassed within the invention are components containing such structures of a simple pin or nip type. It appears to be sufficient with such a structure that a single diode polarity be provided by contrast to the antiserially connected double diodes of the pinip or nipin structure types commonly thought to be necessary.

By variation of the voltage applied to pin, nip, pinip or nipin structures according to the invention, the spectral sensitivity of these structures or components can be shifted in the range from the far ultraviolet (UV) to the near infrared (IR) and the desired corresponding boundary conditions can be selected.

Advantageously, the structure according to the invention is so provided that it allows continuous adjustment of the voltage applied to the structure and thus detection of different wavelengths by such variation, thereby at least reducing the requirements for superposition which has hitherto been necessary.

BRIEF DESCRIPTION OF THE DRAWING

The above and other objects, features, and advantages will become more readily apparent from the following description, reference being made to the accompanying drawing in which.

DESCRIPTION AND SPECIFIC EXAMPLES

Figure 1:
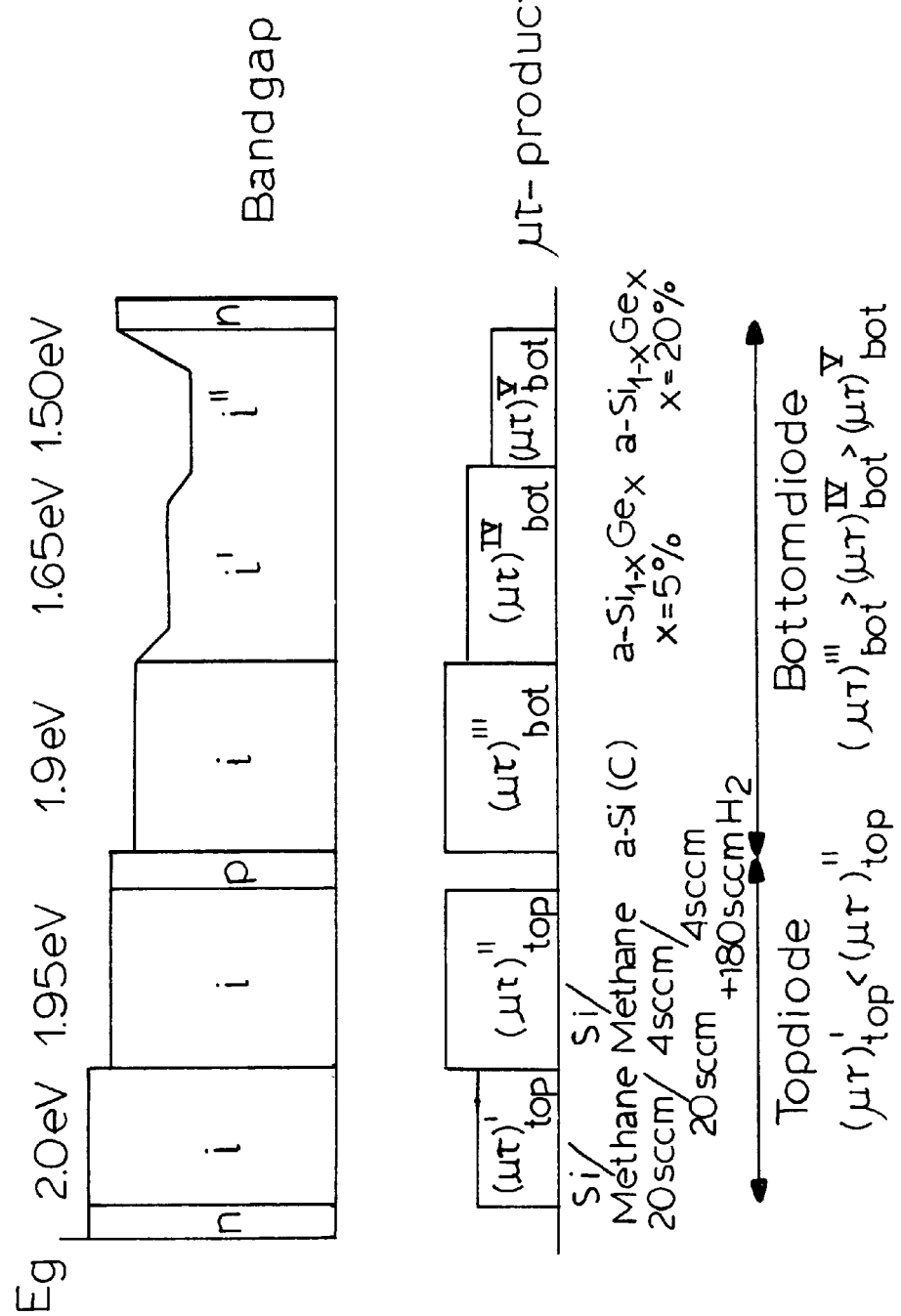
FIG. 1 is a diagram showing the spatial distribution of the band gap $E_g$ and the $\mu\tau$ product of a nipin structure according to the invention for example suitable as a color sensor.

In FIG. 1 the cross section of a nipin type structure is shown with a top diode and a bottom diode formed one after the other in the light incidence direction (from left to right). The upper illustration shows the curves of the band gap $E_g$, the lower illustration the curves of the transport characteristic $\mu\tau$ as a function of the location coordinate x in the layer sequence.

The top diode contains a nip structure with two i layers $i^I$ and $i^{II}$. These are so formed that they have a band gap $Eg^I$=2.0 eV and $Eg^{II}$=1.95 eV, respectively. These layers are fabricated with the aid of a silane-methane mixture in a ratio of 20 sccm/20 sccm for $i^I$ and 4 sccm/(4 sccm with 180 sccm H2) for $i^{II}$. The individual i layers of both the top and bottom diodes had constant values for $E_g$ and $\mu\tau$.

The rear bottom diode contains a pin structure with three i layers $i^{III}$, $i^{IV}$ and $i^V$. These are so formed that they have a band gap of $Eg^{III}$=1.9 eV, $Eg^{IV}$=1.65 eV and $Eg^V$=1.50 eV. These i layers $i^{III}$, $i^{IV}$ and $i^V$ are prepared of amorphous Si(C), $Si_{1-x}Ge_x$ (with x=0.5) or $Si_{1-x}Ge_x$ (with x=0.20).

Figure 2:
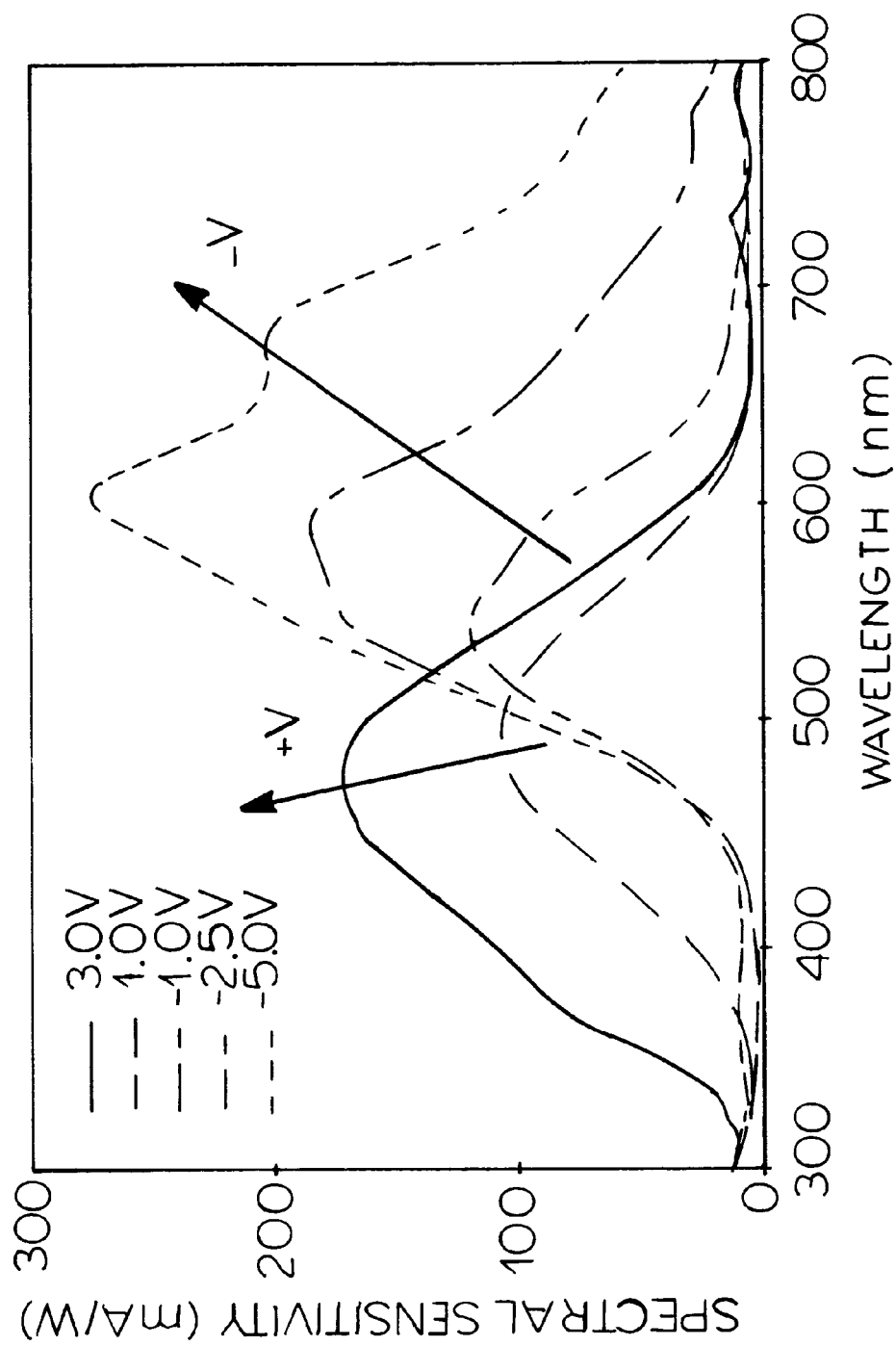
FIG. 2 is a graph of the spectral sensitivity versus wavelengths of a nipin structure according to FIG. 1.

In FIG. 2 an example of a five-color sensor with a structure according to FIG. 1 is demonstrated which has a positive high voltage (the front diode is in the blocking direction) which sets the spectral sensitivity for a wavelength of 470 nm (collection of all generated charge carriers in the front top diode) with a shift to 500 nm for lower positive voltages.

With different $\mu\tau$ products in the intrinsic layers of the top diode, with smaller positive voltages, the photogenerated electron-hole-pairs are collected in the rear part of the intrinsic i layer (region $\mu\tau^{II}$), while the generated carriers recombine in the region of the reduced $\mu\tau$ product.

The different $\mu\tau$ products are obtained for example by the use of materials which are fabricated with different hydrogen dilutions. The electric field rises only upon the application of higher positive voltages above the top diode and the charge carrier pairs can then be collected in the front region of the intrinsic i layer of the top diode.

For negative voltages or for the rear bottom diode, three different regions are realized with different $\mu\tau$ products. By applying negative voltages, the bottom diodes can be blocked and the photogenerated charge carriers can be collected in this diode. For small negative voltages, the charge carrier pairs are collected in the regions $(\mu\tau)^{III}$ (maximum of the spectral sensitivity at 550 nm), while they recombine in all other regions $(\mu\tau)^{IV}$ and $(\mu\tau)^V$ by the employment of material with reduced life time. If one increases the electric field above the intrinsic layer in the bottom diode, one can collect the charge carriers in the regions with $(\mu\tau)^{III}$ and $(\mu\tau)^{IV}$, while the photogenerated charge carriers are recombined further in the region with $(\mu\tau)^V$ (maximum of the spectral sensitivity at 595 nm).

With still higher applied negative voltages, all photogenerated charge carriers collect in the bottom diode and a further maximum in the spectral sensitivity at 650 nm is observed. Thus, for example with voltage values of +3V, 1V, -1V, -2V and -4V, respective linearly dependent curves of the spectral sensitivity can be detected.

With many other i layer regions with respective different transport characteristics ($\mu\tau$ products) a substantially continuous voltage dependent spectral sensitivity can be realized. In this case, the structure with its very many i layers with respective different band gaps and transport characteristics becomes equivalent to a structure with one i layer and within which there are variable band gaps and/or transport characteristics. This embodiment also falls within the subject matter of the appended claims and as such is claimed.

The transport characteristics can be adjusted or varied by one or more of the following features given by way of example:

a) incorporation of germanium (Ge), carbon (C), nitrogen (N) or oxygen (O) in the amorphous silicon (a-Si) lattice, for example a-SiGe:H, a-SiC, a-SiH, a-$Si_{1-x}N_x$:H or a-$Si_{1-x}O_x$:H;

b) introduction of hydrogen or variation of the hydrogen concentration in the process gases both for a-Si:H and for its alloys as mentioned under point a);

c) variation of the process parameters as, for example, pressure, temperature or power.

The fabrication conditions can have the following effect on the transport characteristics given in detail of an a-Si:H based alloy:

The optoelectronic characteristics of amorphous silicon (a-Si:H) can be influenced by variation in the fabrication conditions. For example, the material quality can be changed by variation of the deposition pressure, the temperature, the supplied electric power or by suitable addition of further process gases (e.g. hydrogen, helium, argon, fluorine) in the layer deposition. This means that the charge carrier transport characteristics (i.e. the product of charge carrier life and charge carrier mobility as well as the ambipolar diffusion length) can be adjusted in a targeted manner.

For amorphous silicon alloys, as for example in silicon-germanium (a-$Si_{1-x}Ge_x$:H) and silicon-carbon alloys (a-$Si_{1-x}C_x$:H) the transport characteristics change in part very to strongly just as a result of the composition of the respective alloy. This result has been illustrated for example for the silicon germanium alloy in FIGS. 3–5.

Figure 3:
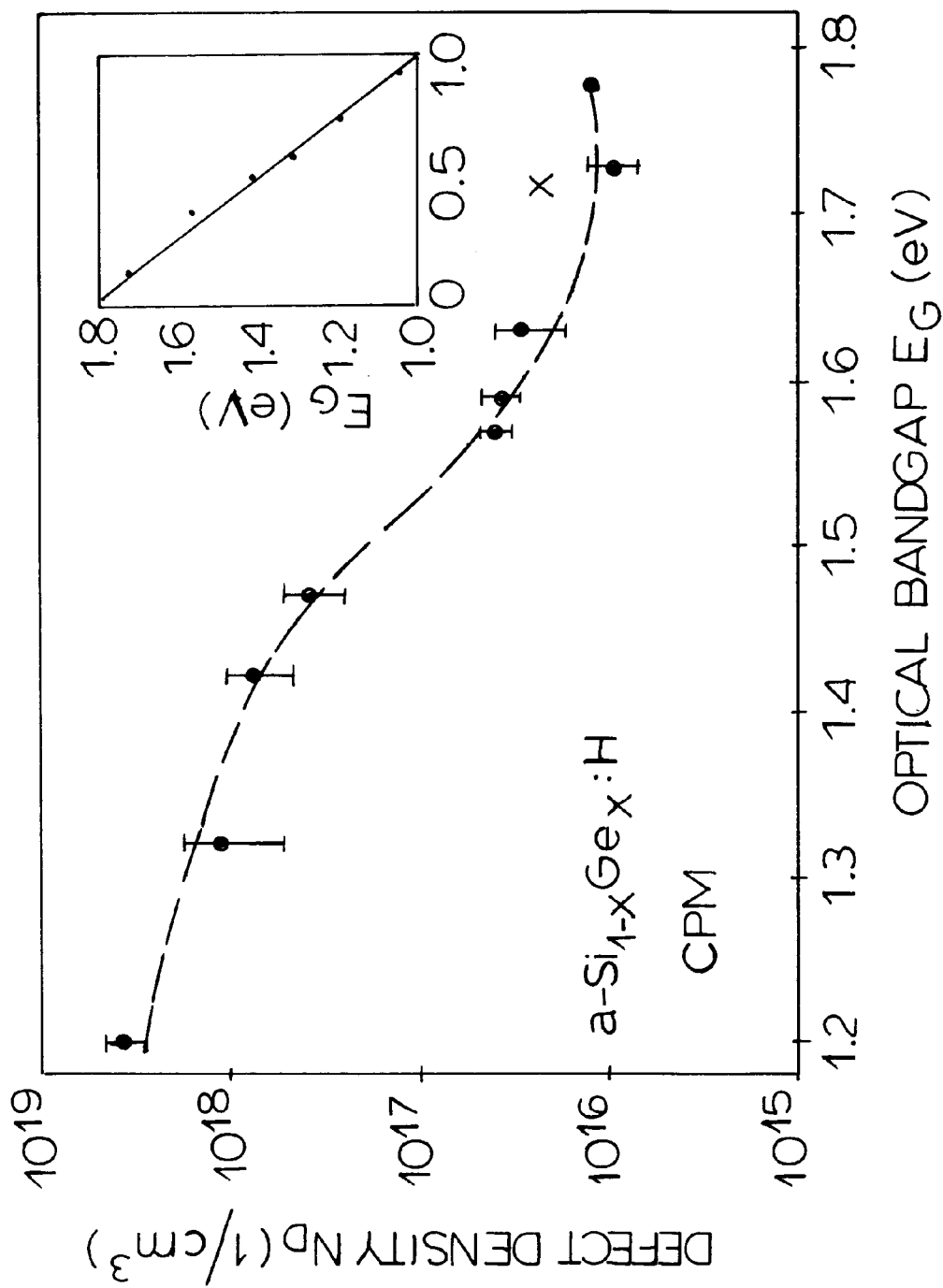
FIG. 3 is a graph the defect density $N_D$ as a function of the optical band gap for a-$Si_{1-x}Ge_x$:H, whereby in the inset, the optical band gap is shown as a function of the germanium content in the material.
Figure 4:
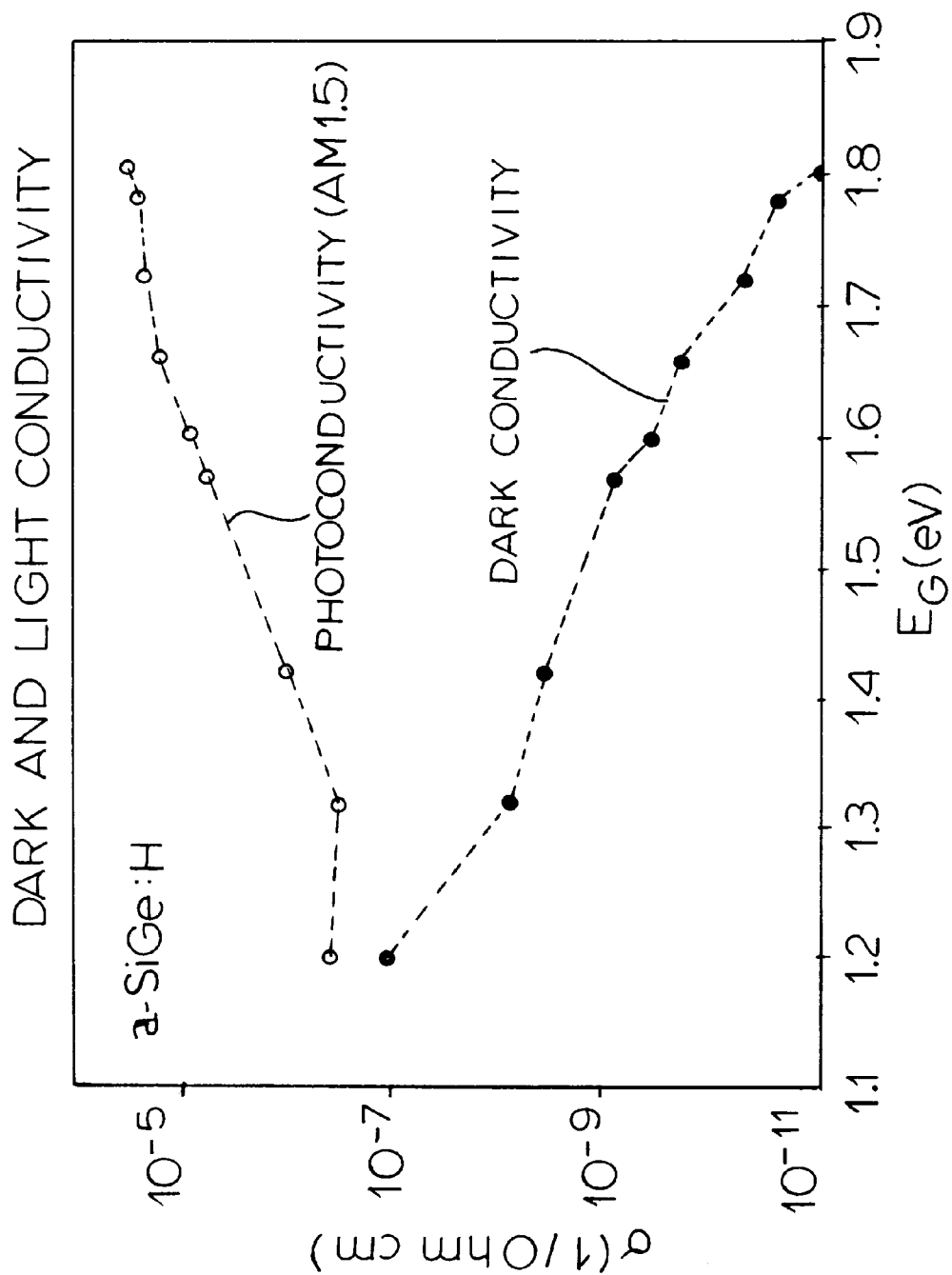
FIG. 4 is a graph of the photoconductivity ((○) at AM 1.5) and dark conductivity (•) σ as a function of the optical band gap $E_g$ for a-$Si_{1-x}Ge_x$:H.

With increasing germanium content, the optical band gap can be continuously adjusted between $E_G \approx 1.8$ eV (a-Si:H) and $E_G \approx 1.0$ eV (a-Ge:H) as can be seen from the insert in FIG. 3. With increasing Ge content the defect density increases as detected by the measuring set up known as the "constant photo current method" by two orders of magnitude or more (FIG. 3 large Figure). Simultaneously, the photoconductivity and the dark conductivity change (see FIG. 4) as well as the ambipolar diffusion length (see FIG. 5) in dependence of the alloying composition.

Figure 5:
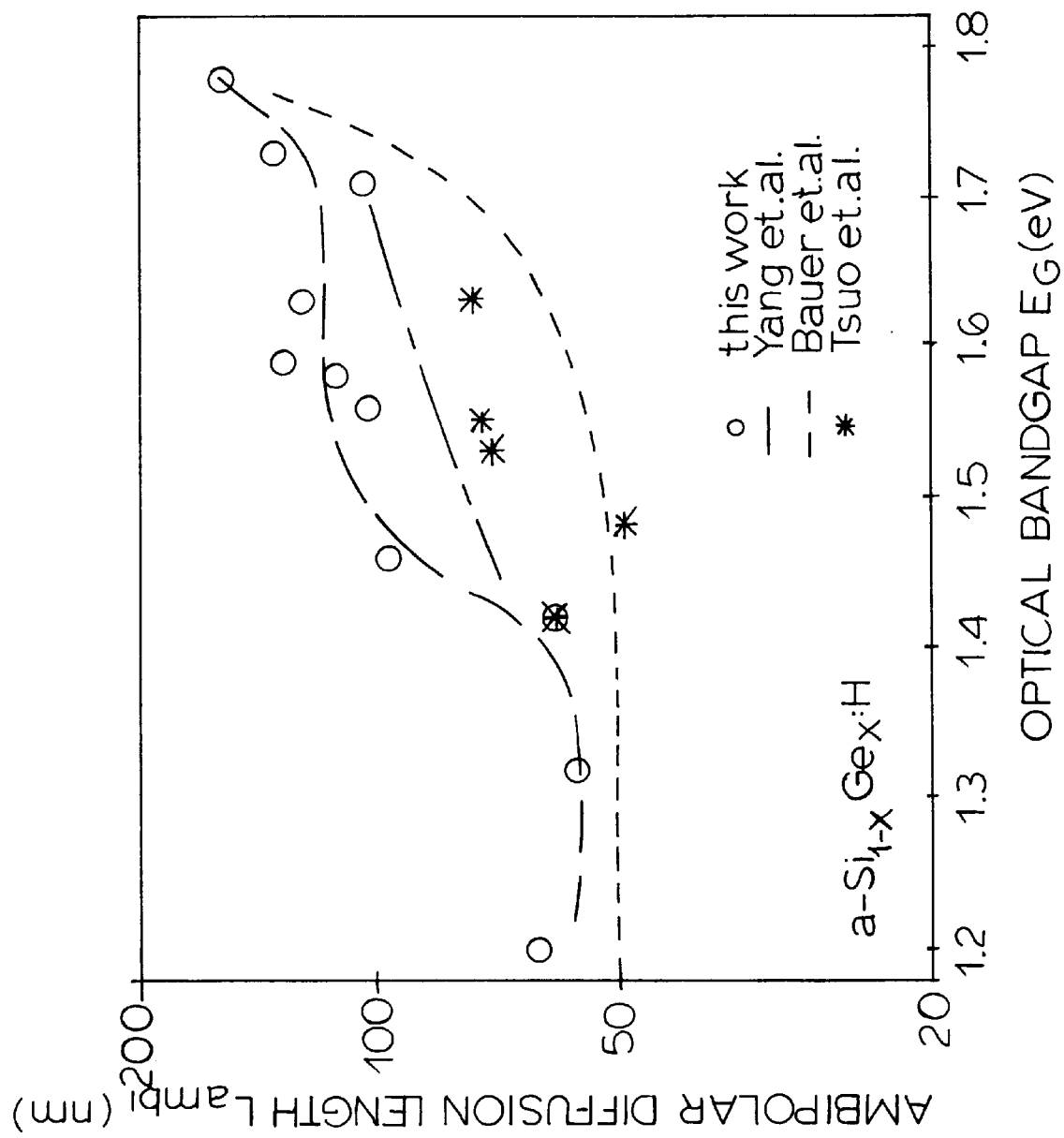
FIG. 5 is a graph of the ambipolar diffusion length $L_{ambi}$ as a function of the optical band gap $E_g$ for a-$Si_{1-x}Ge_x$:H by comparison to values known from the literature, namely, YOUNG et al, BAUER et al and TSAO et al.

The comparison in FIG. 5 is based upon the following references:

W. Luft, Y. S. Tsuo: Hydrogenated Amorphous Silicon Alloy Deposition Processes, Marcel Dekker Inc., New York, Basel, Hong Kong, (1993).

G. H. Bauer, C. E. Nevel and H. -D. Morhing, Mat. Res. Soc. Symp. Proc. 118, 679 (1988).

Figure 6:
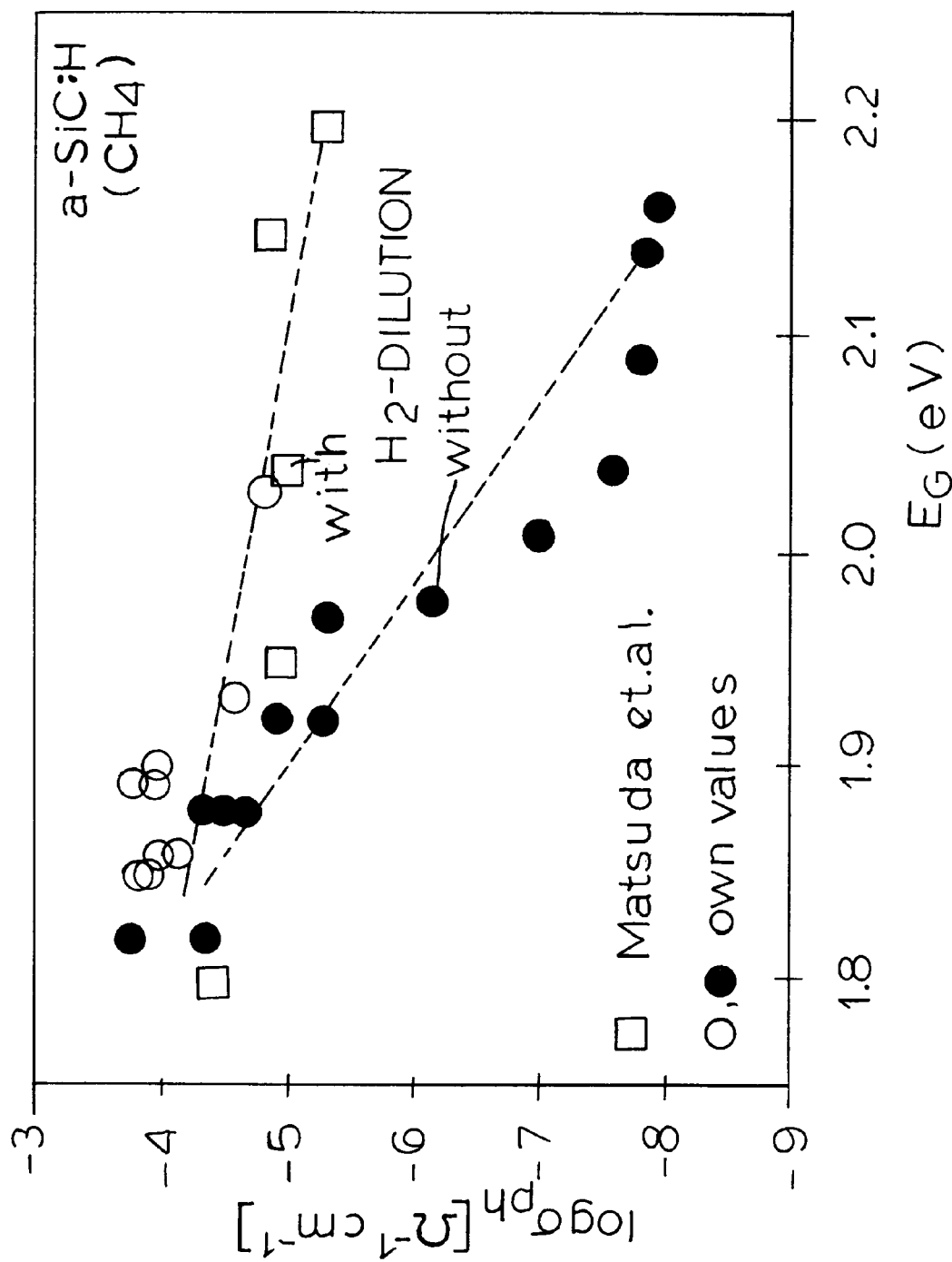
FIG. 6 is a graph of the photoconductivity σ as a function of the optical band gap $E_g$ for a-$S_{1-x}Ge_x$:H made from a silane/methane mixture with hydrogen dilution (○) and without hydrogen dilution (•), squares according to MATSLIDA et al.

L. Yang, L. Chen, A. Catalano, Mat. Res. Soc. Symp. Proc. 219, 259 (1991). The photoconductivity is then proportional to the product of the charge carrier life $\tau$ and mobility $\mu$ and mirrors the transport characteristics of the majority charge carriers (here electrons). The ambipolar diffusion length identified material substantially the transport characteristics of the minority charge carriers (here holes). Furthermore, (as in the case a-Si:H), at silicon alloys preparative approaches can be used (as have been described above), especially by supply of additional process gases during the deposition to influence the transport characteristics [Matsuda 1,2]. As an example for the alloy system a-$Si_{1-x}C_x$:H, the influence of hydrogen addition ("hydrogen dilution") to the process gases silane ($SiH_4$) and methane ($CH_4$) has been given in FIG. 6. (the comparison is based upon the following reference:

J. Fölsch, Dissertation, Universität Stuttgart 1995, in: Berichte des Forschungszentrums Jülich, Jül-3147 (1995). That material made with greater hydrogen dilution has a substantially greater photoconductivity and hence higher values for the $\mu\tau$ product than is the case where the material is deposited without $H_2$ supply. This effect sharply increases with increasing C (carbon) content in the material. The ratio of [$H_2$] to [$SiH_4$] + ([$CH_4$]) can assume in this case values for example of 10 to 50.

From the literature and prior art relating to pin solar cells, it is known that the collection of blue light in pin diodes can be reduced by a doping gas drag (as for example boron) in front regions and increased (for example) by a phosphorous doping in the i layer. By the combination of microdoping and simultaneous variation of the band gap $E_g$ and the transport characteristics in the individual i layers, spectral color separation can be further improved. This will be described still further in connection with the top diode (nip structure) of a nipin structure (FIG. 7, FIG. 8).

Figure 7:
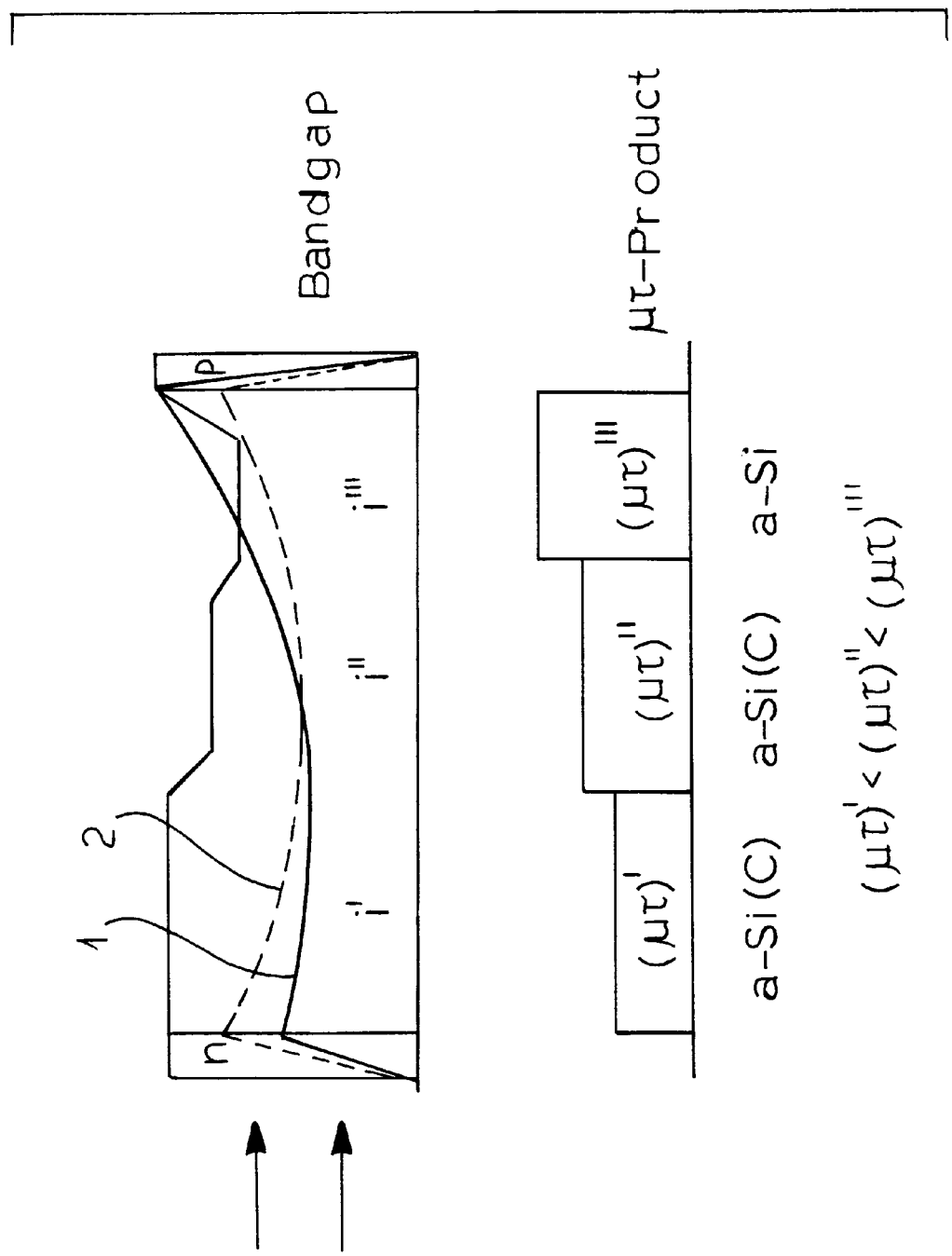
FIG. 7 is a diagram showing the effect of microdoping on the electric field for a nip structure with three i-layer regions I, II and III which have different transport properties ($\mu\tau^I$, $\mu\tau^{II}$, $\mu\tau^{III}$) for the charge carriers.
Figure 8:
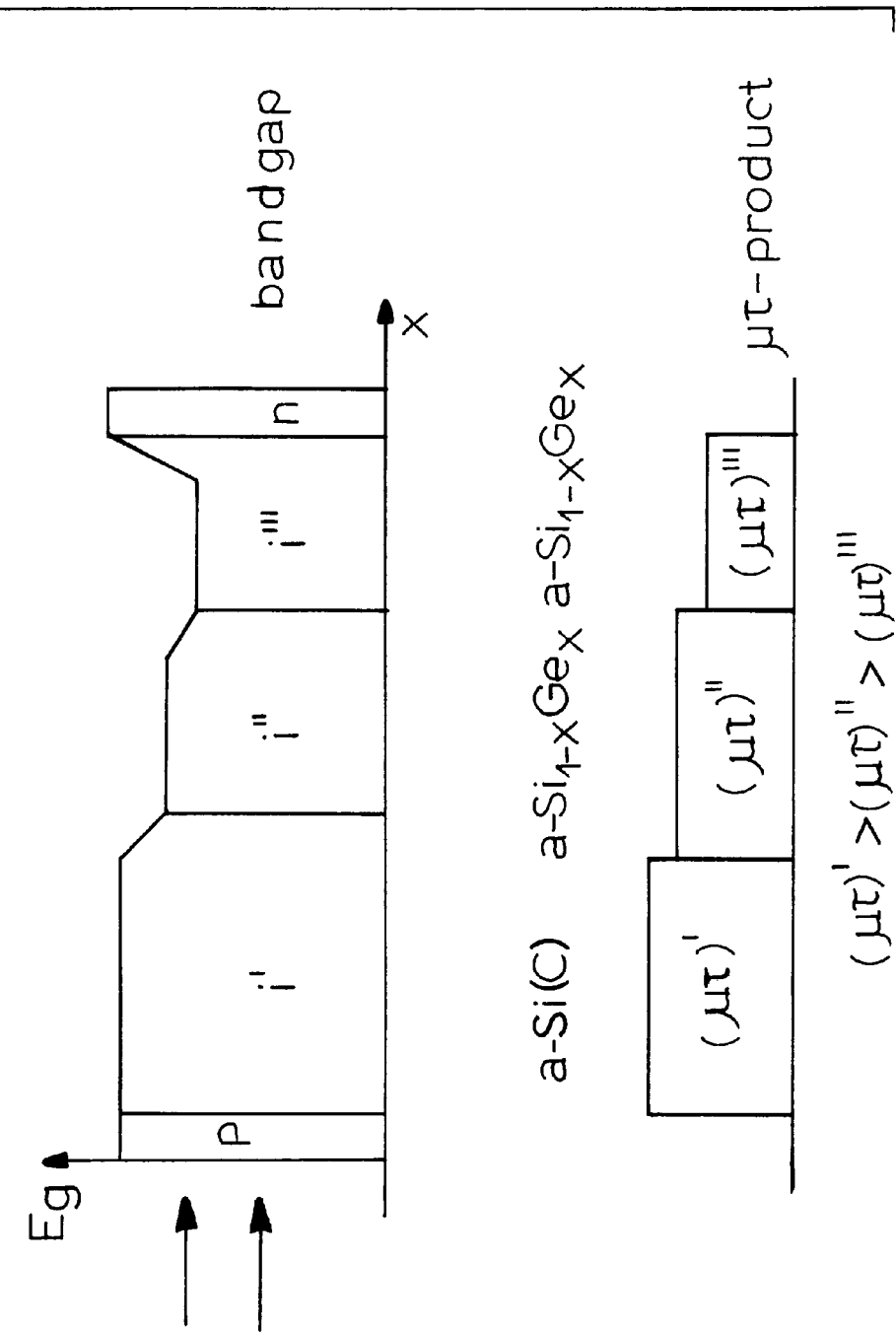
FIG. 8 is a diagram in the form of a band gap profile and showing variation of the transport characteristics of a color sensor based on a pin structure.

FIG. 7 shows the curves [graph] of the band gap Eg and the transport characteristics $\mu\tau$ as a function of the coordinates of the nip structure according to the invention with three i layers.

By incorporation of phosphorous (FIG. 7, curve 1) a positive locally fixed charge is incorporated in the absorber layers. Thus the electric field in the region of p/i transition is raised while it is reduced in other parts of the absorber layer (in the region of the i/n transition). Thus the locally dependent collection is supported by the local dependency of the electric field distribution. The opposite fact is observed for the incorporation of boron (FIG. 7, curve 2).

It will be self understood that corresponding optimization of the color separation, for example by the incorporation of phosphorous, can be obtained also in the bottom diode of a nipin structure or in the intrinsic i layers of a pinip structure.

Furthermore, with the aid of partial doping, individual i layers of the modified absorber layer (with example boron, phosphorous, arsenic or fluorene) the field and, therefore, the wavelength dependent collection efficiency can also be altered or adjusted.

For multicolor sensors based on a nip structure or pin structure, as can be deduced for example from FIG. 7 or FIG. 8, the following applies:

A nip or pin structure suitable as a photodiode according to the invention, whose spectral sensitivity can be shifted by the variation of the applied voltage, enables the formation of a unipolar detector. In this case only a single polarity characterizes the voltage applied to the structure for the detection of the three known colors (red, green and blue) or other colors or, where appropriate, a plurality of these colors are to be detected.

Since with the structure of the invention in for example a bottom diode, three linearly independent equations apply to the detection of three or more colors in the aforedescribed manner even one structure based on pin or nip layer sequence base with a respective plurality of i layers can suffice. The pin or nip layer sequence with a respective plurality of i layers according to the invention satisfies the objects set forth above better than the characteristics of the known antiserial pinip or nipin layers sequences of nor expensive construction. According to the invention, it is possible to obtain also a unipolar three color sensor or multicolor sensor with a pin structure or nip structure basis, especially based on amorphous silicon or its alloys.

One such structure suitable for forming a sensor also has the advantage that for the formation of a sensor array with the aid of such a structure there is a significantly reduced coupling of neighboring pixels since this structure in comparison to a nipin or pinip structure has no conductive intermediate p layer or n layer neighbored on both sides by i layers. In addition, for the applied voltage advantageously only a single polarity is necessary.

In addition, the structure according to the invention has transient properties which are improved with respect to a detector based on two antiserial diodes because recharging processes of the stored charge in the top diode or bottom diode do not arise as have been observed by pinip or nipin structures.

Advantageously and also desirable is the use of three or more i layers with each having a respective but different $\mu 96$ product. To optimize the system, a microdoping can be carried out analogous to that with nipin structures. For such doping, phosphorous, boron or arsenic can be used.

Figure 9:
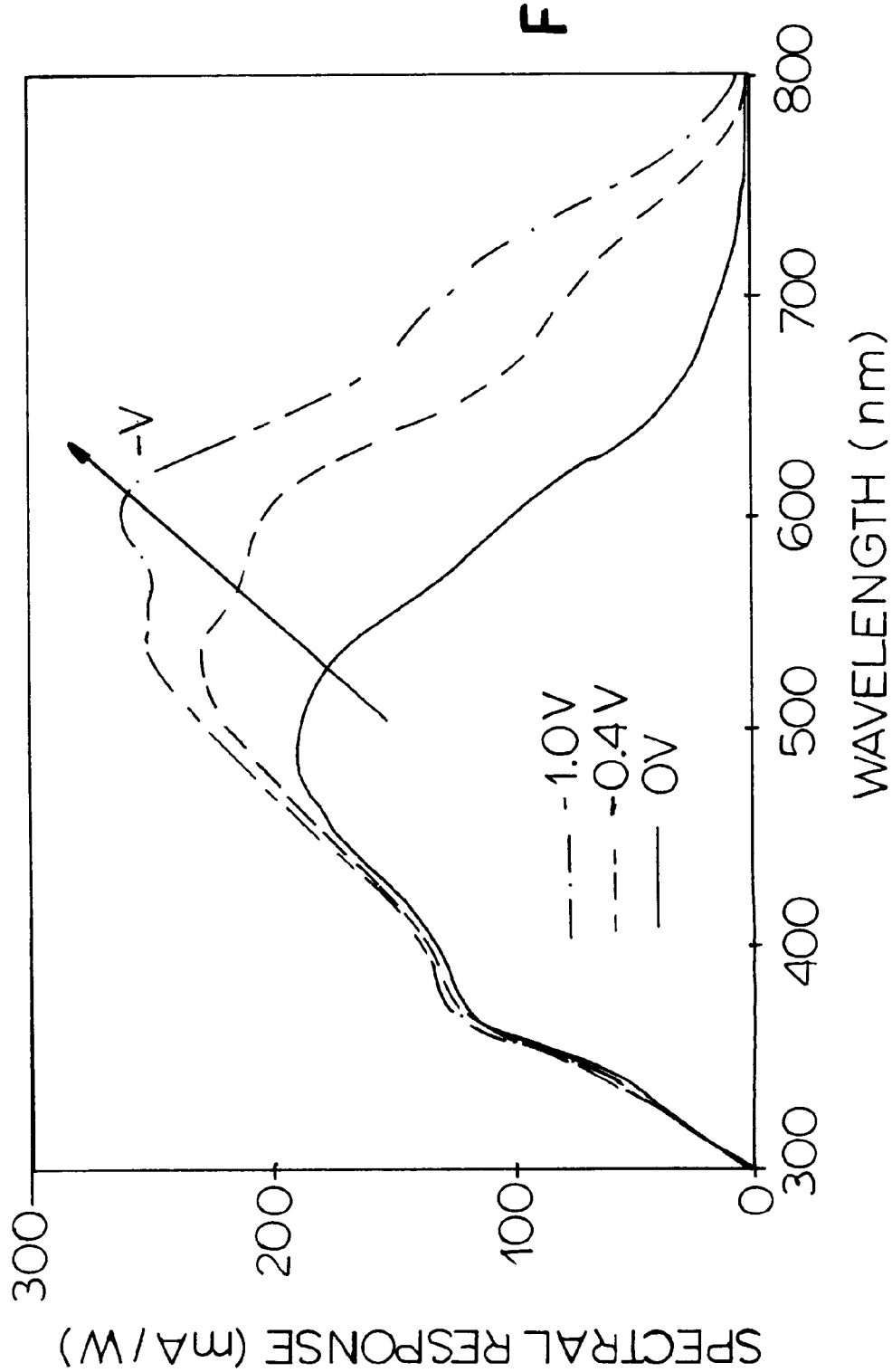
FIG. 9 is a graph of the voltage dependent spectral sensitivity of a unipolar color sensor on the basis of a pin structure with three I layer regions.

For a pin structure, the band gap $E_g$ in the light incident direction is reduced at the boundary regions between neighboring I layers. The absorber layers can be subdivided into three regions with different $\mu\tau$ products, whereby the transport characteristics of the material used is poorer from the p conductive layer to the n conductive layer as has been illustrated in FIG. 8. In FIG. 9 the measurement results for a structure according to FIG. 8 have been shown to include for a rising negative applied voltage, the shift in the spectral sensitivity and the targeted adjustability as a function of the wavelength of the light.

In a nip structure the band gap is also reduced from the light impingement direction (n layer) while the transport characteristics in the three different regions improve from the n layer to the p layer.

Figure 10A:
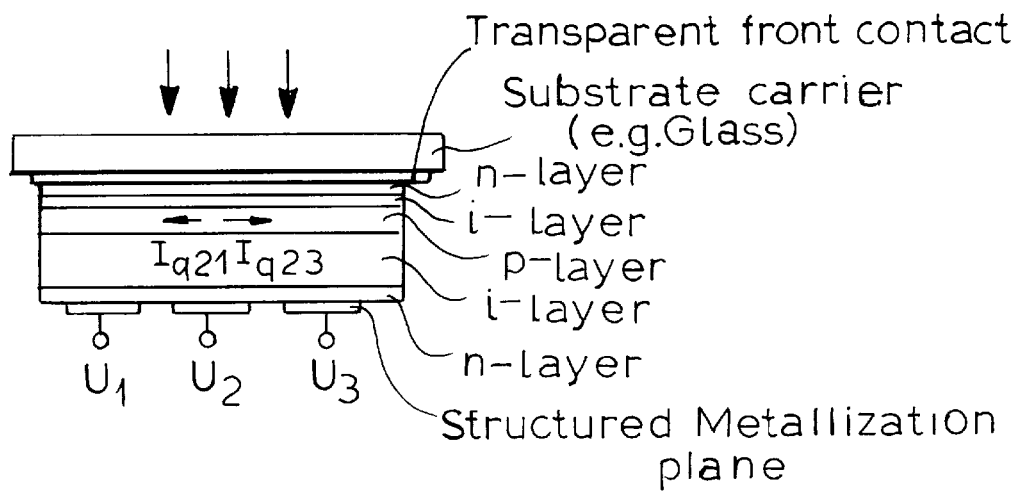
FIGS. 10A and 10B are diagrammatic sections through layer structures according to the invention.
Figure 10B:
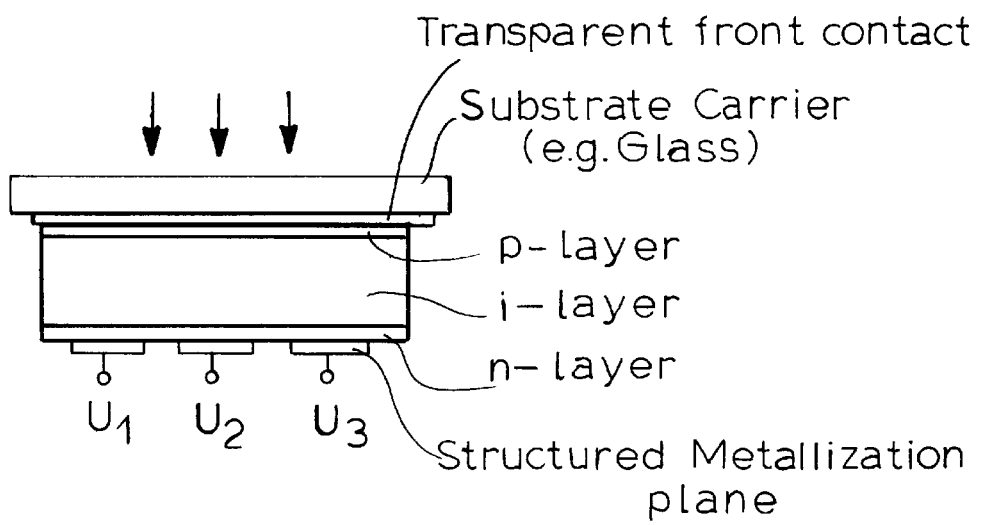

To FIGS. 10A and 10B in which a linear sensor array or two dimensional sensor array of the nipin or pin color sensor type schematically shown, the following applies. The high conductivity of doped n and p layers gives rise to coupling currents perpendicular to the light incident direction in unstructured arrays. The size of an active pixel in an unstructured sensor array is defined by its back contact (structured metallized plane). A coupling current ($I_q$) which thus arises is superimposed on the photocurrent and hinders or obstructs the evaluation of the signal. Coupling processes via the n layer (last semiconductor layer before the back contact), in the case of a nipin diode or pin diode (in a pinip detector, corresponding to the p layer) can be limited by technological steps (for example inverted deposition on a structured substrate in which the n layer breaks away from previously defined pixel edges) or by a special design of the read out electronics ($U_1=U_2=U_3\ldots$). The coupling via the p layer in a nipin detector (corresponding to coupling via the n layer in a pinip diode) permits such a reduction only in the case of complete patterning (removal of the thin layer system between individual pixels) of the array or by the transition to a unipolar detector (pin or nip diode) where the complex i layer system is not interrupted by a layer with high conductivity. Since patterning of the complete array is technologically expensive and cost intensive, the formation of an unstructured sensor array of pin or nip diodes which allow separation of three or more spectral components of the light, represents an advance from the point of view of reduction in the coupling current.

LITERATURE LIST

[1] A. Matsuda, T. Yamaoka, S. Wolff, M. Koyama, Y. Imanishi, H. Kataoka, H. Matsuura, K. Tanaka, J. Appl. Phys. 60, 4025 (1986).

[2] A. Matsuda, K. Tanaka, J. Apl. Phys. 67, 7065 (1990).

[3] W. Luft, Y. S. Tsuo in: Hydrogenated Amorphous Silicon Alloy Deposition Processes, Marcel Dekker Inc., New York, Basel, Hong Kong, (1993).

[4] G. H. Bauer, C. E. Nevel and H.-D. Morhing, Mat. Res. Soc. Symp. Proc. 118, 679 (1988).

[5] L. Yang, L. Chen, A. Catalano, Mat. Res. Soc. Symp. Proc. 219, 259 (1991).

[6] J. Fölsch, Dissertation, Universität Stuttgart 1995, in: Berichte des Forschungszentrums Jülich, Jül-3147 (1995).

We claim:

1. A structure with a plurality of i layers which are bounded on one side with a p layer and on the other side with an n layer, said i layers constituting:
   in an incident light direction at least in a boundary region between two neighboring i layers ($i'$, $i''$), the band gap Eg(I) of the respective first i layer ($i'$) at respectively the side neighboring the light input side, which is greater than the band gap $E_g$(II) of the second neighboring i layer ($i'$) which is further away from the light input side, and
   in a direction from the p to the n layer at least in the boundary region of two neighboring i layers ($i'$, $i''$) the product $\mu\tau$(I) which is greater for the i layer ($i'$) further away from the n layer than the product $\mu\tau$(II) of the i layer ($i''$) more closely neighboring the n layer.

2. A structure according to claim 1 having a pin or an nip structure.

3. A structure according to claim 1 with a multiplicity of i layers (I, II, ...).

4. A structure according to claim 1 wherein the respective band gap $E_g$(I, II, ...) within each of the i layers has a constant value.

5. A structure according to claim 1 wherein the respective product $\mu\tau$(I, II, ...) within each of the i layers has a constant value.

6. A structure according to claim 1 wherein for forming a pinip structure, the n layer on a side neighboring the i layer has a further layer sequence with at least one further i layer, each further layer sequence being bounded by a further p layer.

7. A structure according to claim 1 wherein to form a nipin structure the p layer on its side neighbored by the i layer has a further layer sequence at least one further i layer, each further layer sequences being bounded by a further n layer.

8. An array with a multiplicity of structures according to claim 1 each with a respective pixel forming structure.

9. A structure according to claim 1 in the form of a multicolor sensor.

10. A process for producing a structure according to claim 1 wherein
    a structure with a plurality of i layers is formed which on one side is bounded by a p layer and on the other side is bounded by an n layer, the i layers are selected so that
    in a light incident direction at least in the boundary region of two neighboring i layers a band gap $E_g$(I) of the first i layer which respectively more closely neighbors the light incident side is greater than the band gap $E_g$(II) of the second i layer which is further away from the layer neighboring the light intake side, and
    in a direction from the p layer to the n layer at least in the boundary region between two neighboring i layers ($i'$, $i''$) the product $\mu\tau$(I) of the i layer further away from the n layer is greater than the product $\mu\tau$(II) of the i layer ($I''$) more closely neighboring the n layer.

* * * * *